(12) United States Patent
Wan et al.

(10) Patent No.: US 8,138,841 B2
(45) Date of Patent: Mar. 20, 2012

(54) APPARATUS AND METHOD FOR CONTROLLING THE OUTPUT PHASE OF A VCO

(75) Inventors: Kwun Chiu Wan, Kowloon (HK); Quan Xue, Kowloon (HK)

(73) Assignee: City University of Hong Kong, Kowloon Tong (HK)

( * ) Notice: Subject to any disclaimer, the term of this patent is extended or adjusted under 35 U.S.C. 154(b) by 0 days.

(21) Appl. No.: 12/461,661

(22) Filed: Aug. 19, 2009

(65) Prior Publication Data

US 2011/0043289 A1    Feb. 24, 2011

(51) Int. Cl.
    *H03L 7/00*    (2006.01)
(52) U.S. Cl. .............. 331/11; 331/16; 331/18; 331/25
(58) Field of Classification Search ............ 331/11, 331/16, 17, 18, 25; 327/156, 159
    See application file for complete search history.

(56) References Cited

U.S. PATENT DOCUMENTS

| | | | |
|---|---|---|---|
| 5,369,790 A | 11/1994 | Yokota | |
| 5,483,695 A | 1/1996 | Pardoen | |
| 5,625,324 A | 4/1997 | Hsu et al. | |
| 6,150,890 A | 11/2000 | Damgaard et al. | |
| 6,741,846 B1* | 5/2004 | Welland et al. | 455/260 |
| 6,915,081 B2* | 7/2005 | Takeshita et al. | 398/188 |
| 7,109,803 B2 | 9/2006 | Rebel | |
| 7,218,157 B2* | 5/2007 | Van De Beek et al. | 327/156 |
| 7,298,217 B2* | 11/2007 | Adlerstein et al. | 331/12 |
| 7,324,788 B2* | 1/2008 | Ramet et al. | 455/76 |
| 7,339,861 B2* | 3/2008 | Minamino et al. | 369/47.28 |
| 7,372,337 B2 | 5/2008 | Nayler | |
| 7,486,145 B2* | 2/2009 | Floyd et al. | 331/1 A |
| 7,499,689 B2* | 3/2009 | Uozumi et al. | 455/260 |
| 7,564,313 B2* | 7/2009 | Hung et al. | 331/11 |
| 2002/0140513 A1* | 10/2002 | Maneatis | 331/45 |
| 2008/0265999 A1 | 10/2008 | Wan et al. | |

FOREIGN PATENT DOCUMENTS

WO   WO 2005/099086   10/2005

OTHER PUBLICATIONS

Nagra et al., "Distributed Analog Phase Shifters with Low Insertion Loss," Sep. 1999, pp. 1705-1711, vol. 47, No. 9, IEEE Transactions on Microwave Theory and Techniques.

(Continued)

*Primary Examiner* — Shawki S Ismail
*Assistant Examiner* — Christopher Lo
(74) *Attorney, Agent, or Firm* — Stites & Harbison PLLC; Douglas E. Jackson (57) ABSTRACT

A method and apparatus controlling the output phase of a VCO (Voltage Controlled Oscillator). The apparatus has a phase locked loop 20 having a first input 21 for receiving a reference signal and a second input 22 for receiving a feedback signal and the output for controlling of a VCO. A phase shifter 50 is provided on the feedback path between the VCO and the second input of the phase locked loop. The phase shifter is arranged for shifting the phase for feedback signal by controlled amount. The phase shifter may be a variable phase shifter for controlling and varying the amount by which the phase feedback signal is shifted.

15 Claims, 6 Drawing Sheets

OTHER PUBLICATIONS

Barker et al., "Optimization of Distributed MEMS Transmission-Line Phase Shifters—$U$-Band and $W$-Band Designs," Nov. 2000, pp. 1957-1966, vol. 48, No. 11, IEEE Transactions on Microwave Theory and Techniques.

Ellinger et al., "Varactor-Loaded Transmission-Line Phase Shifter at $C$-Band Using Lumped Elements," Apr. 2003, pp. 1135-1140, vol. 51, No. 4, IEEE Transactions on Microwave Theory and Techniques.

Hancock, et al., "A 12-GHz SiGe Phase Shifter With Integrated LNA," Mar. 2005, pp. 977-983, vol. 53, No. 3, IEEE Transactions on Microwave Theory and Techniques.

Jiaguo et al., "Active Phased Array Antenna Based on DDS," Oct. 2003, pp. 511-516, IEEE International Symposium on Oct. 14-17, 2003.

Houghton et al., "Phased Array Control Using Phase-Locked-Loop Phase Shifters," Feb. 1992, pp. 31-37, vol. 139, No. 1, IEEE Proceedings—H Microwaves, Antennas and Propagation.

Buchanan et al., "Triple Mode PLL Antenna Array," Jun. 2004, pp. 1691-1694, vol. 3, IEEE MTT-S Digest.

York et al., "Injection- and Phase-Locking Techniques for Beam Control," Nov. 1998, pp. 1920-1929, vol. 46, No. 11, IEEE Transactions on Microwave Theory and Techniques.

Mak et al., "Experimental Study of a Microstrip Patch Antenna with an L-shaped Probe," May 2000, pp. 777-783, vol. 48, No. 5, IEEE Transactions on Antennas and Propagation.

Miura et al., "Beamforming Experiment with a DBF Multibeam Antenna in a Mobile Satellite Environment," Apr. 1997, pp. 707-714, vol. 45, No. 4, IEEE Transactions on Antennas and Propagation.

Curtis et al., "32-Channel X-Band Digital Beamforming Plug-and-Play Receive Array," Oct. 2003, pp. 205-210, IEEE International Symposium on Oct. 14-17, 2003.

Wan et al., "Indirect Controlled Phased Source," Dec. 2006, pp. 702-704, vol. 16, No. 12, IEEE Microwave and Wireless Components Letters.

\* cited by examiner

APPARATUS AND METHOD FOR CONTROLLING THE OUTPUT PHASE OF A VCO

The present invention relates to a method and apparatus for controlling the output phase of a VCO (Voltage Controlled Oscillator). It may be used in various applications, including but not limited to antenna arrays for receiving radio signals.

BACKGROUND TO THE INVENTION

Adaptive receiving arrays are very useful in many wireless communication applications, including radar, wireless networks, RFID etc. Adaptive receiving arrays can converge energy, receive signals from a desired direction and reject interference from unwanted directions. This increases the communication range and allows spatial multiplexing. Beamforming techniques using phase shifters can be used to implement an adaptive receiving array. However, the use of these techniques is generally limited due to the high cost, complexity and high insertion loss of microwave phase shifters.

Low cost phase shifters using diode loaded transmission lines or micro-electromechanical systems (MEMS) have been proposed. However, in these techniques, the signal energy has to be split between the phase shifting elements by a power divider which has high insertion loss. Therefore the energy loss increases with each additional antenna as the signal needs to be split more ways.

Various active phase shift control circuits have been proposed including circuits using a digital signal processor or direct digital synthesizer. However, those circuits are very expensive.

Figure 1:
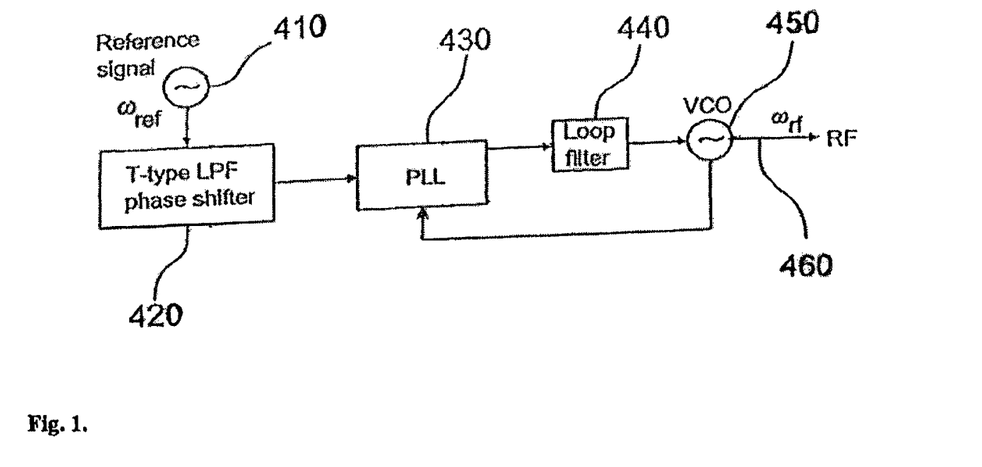
FIG. 1 shows a prior art indirect controlled phased source.

The inventors previously invented an indirect controlled phased source (ICPS), which was disclosed in their application U.S. Ser. No. 11/739,198 filed on 24 Apr. 2007, which is incorporated herein by reference. An example of an ICPS is shown in FIG. 1. A VCO 450 outputs a radio frequency signal 460, which is phase locked to a low frequency reference signal 410 by a phased locked loop 430. A variable phase shifter 420 is provided between the low frequency reference oscillator 410 and the phase locked loop 430. The variable phase shifter 420 shifts the phase of the low frequency reference signal which is input to the phase locked loop. In this way the output phase of the VCO can be indirectly controlled by adjusting the phase shift provided by the phase shifter 420.

SUMMARY OF THE INVENTION

At its most general the present invention proposes a method and apparatus for controlling the output phase of a VCO, in which the phase shifter is positioned on a feedback path between the VCO and a feedback input of the phase locked loop. The phase shifter shifts the phase of a feedback signal on the feedback path by a controlled amount. This amount may be a fixed amount in the case of a fixed phase shifter or a adjustable amount in the case of a variable phase shifter. In the case of a fixed phase shifter the phase shift is controlled by choice of the phase shifter (when manufacturing the apparatus), and choice of the phase shifter determines the output phase of the VCO. In the case of a variable phase shifter, the amount by which the phase of the feedback signal is shifted may be controllably adjusted and this allows the output phase of the VCO to be controlled and adjusted by a desired amount in a controlled manner. As the variable phase shifter is on the feedback path it preferably operates at high frequency (e.g. the same or a similar order of frequency to the output of the VCO). Preferably there is no frequency divider on the feedback path between the VCO and the variable phase shifter. In this way, fine adjustment of the output phase may be achieved.

Through experimentation the inventors' noticed that in the ICPS disclosed in their earlier application U.S. Ser. No. 11/739,198, the resolution of the phase shift of the output signal was limited. In that arrangement, the output signal of the VCO was at a much higher frequency than the frequency of the reference signal fed into the phase locked loop. The reference signal was phase shifted at low frequency and this shift was then magnified by the higher frequency output signal, so either the resolution was limited or a very high resolution phase shifter was needed. Furthermore any error in the phase shift (e.g. due to poor calibration of the phase shifter or drift over time) was magnified in the output signal. In contrast, the present invention may provide a higher resolution phase shift of the output signal and greater accuracy.

A first aspect of the present invention provides an apparatus for controlling the output phase of a VCO. The apparatus comprises a phase locked loop having a first input for receiving a reference signal, a second input for receiving a feedback signal and an output for controlling a VCO. A VCO is coupled to the output of the phase locked loop. A feedback path couples the feedback signal from the VCO to the second input of the phase locked loop. A fixed or variable phase shifter is provided on the feedback path between the VCO and said second input of the phase locked loop. The phase shifter shifts the phase of the feedback signal by a fixed amount in the case of a fixed phase shifter, or by a controllably variable amount in the case of a variable phase shifter. With this above configuration, the output phase of the VCO can be set at a desired level. When the phase shifter is a variable phase shifter, the output phase of the VCO may be controllably varied by adjusting the phase shift of the phase shifter. The phase of the output signal of VCO varies (is shifted) inversely to the phase shift of the phase shifter because the phase locked loop (PLL) is trying to overcome the phase shift provided by the phase shifter on the feedback path. The feedback signal preferably travels through the phase shifter on the feedback path (and has its phase shifted by the phase shifter) before reaching the second input of the phase locked loop.

Preferably the phase locked loop comprises a phase comparator having a first input for receiving a reference signal and a second input for receiving a feedback signal. The apparatus may further comprise a reference oscillator for generating a reference signal, said reference oscillator being coupled to said first input of the phase locked loop.

Preferably the VCO has an output which is coupled to an amplifier. The variable phase shifter is preferably tunable over a range of at least 90 degrees, more preferably at least 180 degrees, more preferably still at least 360 degrees.

The phase shifter comprises a high pass filter and a low pass filter. The phase shifter may be a high frequency phase shifter for shifting the phase of a high frequency signal.

The feedback path may have a frequency divider. Preferably the frequency divider is positioned between the phase shifter and the second input of the phase locked loop. In this way the feedback signal passes through the phase shifter before it passes through the frequency divider.

A second aspect of the present invention provides an apparatus for controlling the output phases of a plurality of VCOs, comprising a plurality of phased locked loops. Each phase locked loop has a first input for receiving a reference signal, a second input for receiving a feedback signal and an output for controlling a VCO. The apparatus has a plurality of VCOs, each VCO being associated with and coupled to the output of a respective phase locked loop. A plurality of feedback paths are provided, each feedback path being between a respective VCO and its associated phase locked loop. Each feedback path has a respective phase shifter for shifting the phase of a feedback signal, travelling along the feedback path, by a controlled amount. The phase shifter is preferably provided on the feedback path itself, so that the feedback signal passes through (and is phase shifted by) the phase shifter. As each feedback path has a respective phase shifter, the output phase of each VCO may be controlled independently of the other VCOs.

The phase shifters may be fixed phase shifters for shifting the phase of a feedback signals by a fixed amount or variable phase shifters for shifting for controllably varying the amount by which the phase of the feedback signal is shifted. A variable phase shifter enables the output phase of its associated VCO to be controllably varied by adjusting the phase shift of the variable phase shifter.

The apparatus may comprise a plurality of amplifiers, wherein each VCO has an output coupled to a respective amplifier. The apparatus may comprise a plurality of antennas and a plurality of mixers. Each antenna may be coupled to a respective mixer and each VCO may be coupled to a respective mixer. The antennas are preferably coupled to first inputs of the mixers. Each VCO preferably has an output coupled to a second input of a respective mixer. Each mixer may have a respective output and the respective outputs of the mixers may be coupled to a combiner. The combiner can then combine the outputs of the respective mixers.

Each feedback path may have a frequency divider. Preferably the frequency divider is positioned between said feedback path's phase shifter and the second input of the phase locked loop associated with said feedback path. In this way the feedback signal passes through the phase shifter before passing through the frequency divider.

A third aspect of the present invention provides a method of controlling the output phase of a VCO comprising providing a phase locked loop having a first input for receiving a reference signal, a second input for receiving a feedback signal and an output coupled to the VCO and providing a variable phase shifter on a feedback path between the VCO and the second input of the phase locked loop; injecting a reference signal into the first input of the phase locked loop and controlling the output phase of the VCO by controlling the phase shift of the variable phase shifter on the feedback path.

A fourth aspect of the present invention provides a method of controlling the output phase of a VCO comprising providing a phase locked loop having a first input for receiving a reference signal, a second input for receiving a feedback signal and an output coupled to the VCO; providing a phase shifter on a feedback path between the VCO and the second input of the phase locked loop; injecting a reference signal into the first input of the phase locked loop, directing a feedback signal from the output of the VCO to the second input of the phase locked loop via said feedback path, shifting the phase of the feedback signal by a controlled amount with the phase shifter before said feedback signal reaches the second input of the phase locked loop and controlling the output phase of the VCO on the basis of said reference signal and said feedback signal which has been phase shifted by said phase shifter. More specifically, the output phase of the VCO is preferably controlled on the basis of the respective phases of the reference and feedback signals.

The phase shifter may be a fixed phase shifter or a variable phase shifter. If the phase shifter is a variable phase shifter, the method preferably further comprises the step of controlling the variable phase shifter to adjust the amount by which the phase of the feedback signal is phase shifted.

The phase locked loop may comprise a phase comparator having a first input for receiving a reference signal and a second input for receiving a feedback signal. The reference signal may be generated by a low frequency reference oscillator. The feedback signal may be a high frequency signal (e.g. at least 500 MHz). The phase shifter on the feedback loop may be arranged for shifting the phase of a high frequency feedback signal.

A fifth aspect of the present invention provides a method of controlling an array of antennas, wherein each antenna in said array is coupled to the output of a respective VCO and the output phase of each VCO is controlled independently according to the method of the third or fourth aspects of the present invention.

Any of the features of any of the above aspects of the invention may be combined together.

BRIEF DESCRIPTION OF THE DRAWINGS

Embodiments of the invention will now be described, by way of example only, with reference to the accompanying drawings in which.

DESCRIPTION OF THE PREFERRED EMBODIMENTS

Figure 2:
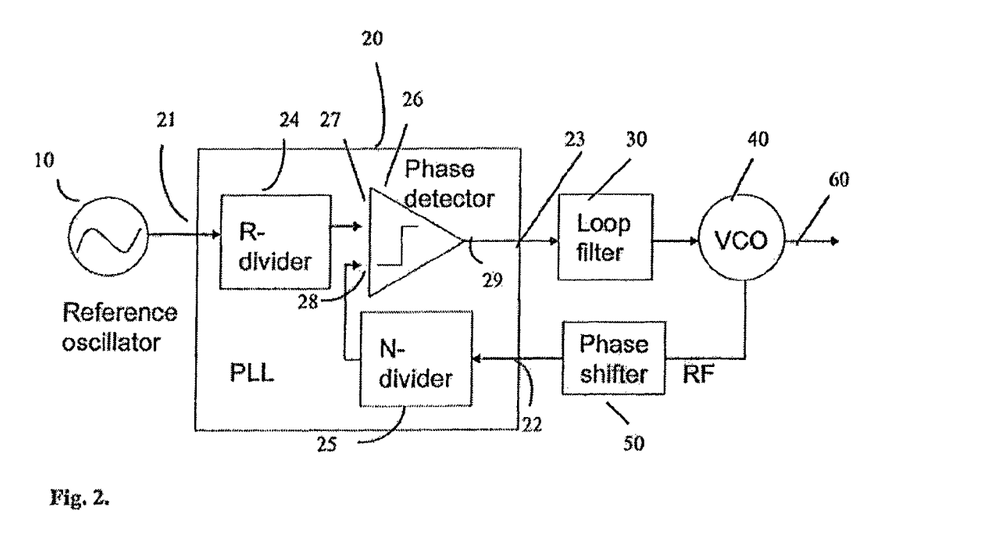
FIG. 2 shows an apparatus for controlling the output phase of a VCO, having a phase shifter on the feedback path.

An apparatus for controlling the output phase of a VCO is shown in FIG. 2. The apparatus is essentially a radiation source having controllable output phase. The phase of the output signal is controlled indirectly by a phase shifter.

The apparatus comprises a phase locked loop 20, a VCO 40 and a phase shifter 50. The phase locked loop 20 has a first input 21 for receiving a reference signal, e.g. from a reference signal oscillator 10. The phase locked loop has a second input 22 for receiving a feedback signal from the VCO. The phase locked loop (PLL) has an output 23 which is coupled to an input of the VCO 40. The output of the phase locked loop controls the VCO as is known in the art. In this embodiment a loop filter 30 is coupled between the output of the PLL and the input of the VCO. The signal (e.g. voltage) received by the input of the VCO determines the frequency and phase of its output signal 60.

In this preferred embodiment, the phase locked loop comprises a first frequency divider 24 ("the R-divider"), a second frequency divider ("the N-divider") and a phase comparator 26. The first frequency divider divides the frequency by a ratio of R and the second frequency divider divides the frequency by a ratio of N. These frequency dividers enable the PLL to operate at a lower frequency than that of the VCO and the reference oscillator.

The phase comparator 26 has a first input 27 for receiving a reference signal (which has been divided by the first frequency divider) and a second input 28 for receiving a feedback signal (which has been divided by the second frequency divider). The phase comparator outputs a signal (e.g. a control voltage) which is dependent upon the difference between the phase of the signals received at its first and second inputs. For example, the phase comparator may comprise a comparator and a current buffer, and may output a positive or negative current pulse according to the phase difference between its two inputs. This output control signal controls the VCO and adjusts the output phase of the VCO. In particular the phase locked loop adjusts the output of the VCO in a way which tends to synchronize the phase and frequency of the two input signals. When the signals received at the first 21 and second inputs 22 of the phase locked loop are equal, the signals received at the first and second inputs of the phase comparator 26 are equal and the circuit reaches a steady state.

The phase shifter 50 is a variable phase shifter which is capable of adjusting the phase of a signal passing through it by a variable amount. The amount by which the phase is adjusted (e.g. delayed) may be varied in a controlled manner. There are many types of variable phase shifter, some are controlled mechanically, others magnetically or electrically. The range of a variable phase shifter is the range over which it can be tuned to shift phase. For example, a variable phase shifter having a range of 0-180 degrees can shift the phase of a signal over the range 0-180 degrees. It is preferred that the variable phase shifter used in this embodiment has a range of at least 0-360 degrees, to give a wide range of available phases. Electronic or digital variable phase shifters tend to shift the phase in discrete steps, e.g. steps of several degrees. The smaller the phase shift steps the higher the resolution of adjustment for the VCO output signal.

This is in contrast to the prior art system of FIG. 1 where the variable phase shifter is on the reference signal path and the phase shift is magnified so that even a small phase shift can result in a large phase shift of the VCO output signal. In that system the phase shifter does not have to have such a wide phase shift range as even a small range will be magnified to a large one by the PLL.

Preferably the PLL and VCO are provided as an integrated circuit on a single chip as this reduces cost. In the arrangement of FIG. 2 the feedback signal passes through the phase shifter 50 before passing through a frequency divider 25 on the feedback path.

By controllably adjusting the phase shift of the phase shifter 50 on the feedback path, the output phase of the VCO 40 can be controllably adjusted. The adjustment of output phase of the VCO is inverse to the adjustment of phase shift of the phase shifter, as the PLL attempts to counteract the phase shift of the phase shifter.

Figure 3:
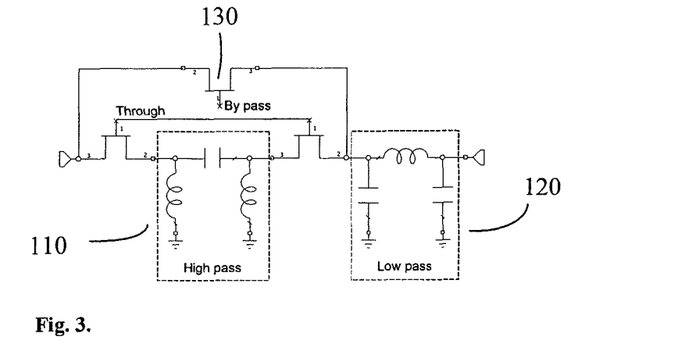
FIG. 3 is a circuit diagram of a variable phase shifter.
Figure 4:
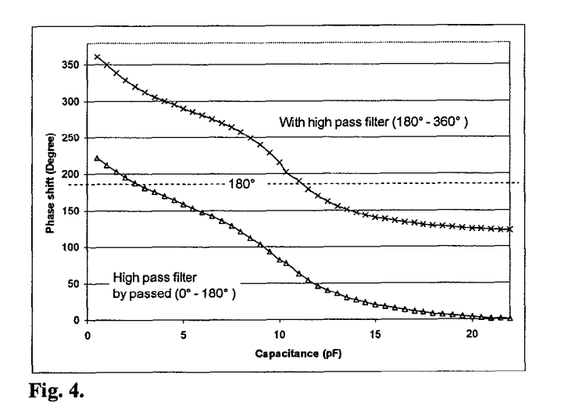
FIG. 4. is a graph showing the performance of the variable phase shifter of FIG. 3.

Many different types of variable phase shifter could be used and will be apparent to a person skilled in the art. FIG. 3 shows one example of a circuit diagram for a variable phase shifter. The circuit has a high pass filter 110, a low pass filter 120 and a switchable by-pass 130 for by-passing the high pass filter 110. The filters are preferably pi type filters. The phase shifter is capable of shifting the phase of a signal through a range 0 to 360 degrees. When the desired phase shift is in the range 0-180 degrees only the low pas filter 120 is used and the by-pass is switched to by-pass the high pass filter 110. When the desired phase shift is in the range 180-360 degrees both high and low pass filters are used. The by-pass is switched off and the signal passes through the high pass filter. FIG. 4 is a graph showing the variation of phase shift with capacitance for the variable phase shifter of FIG. 3. The upper line is when the high pass filter is used and the lower line is when the high pass filter is by-passed.

Figure 6:
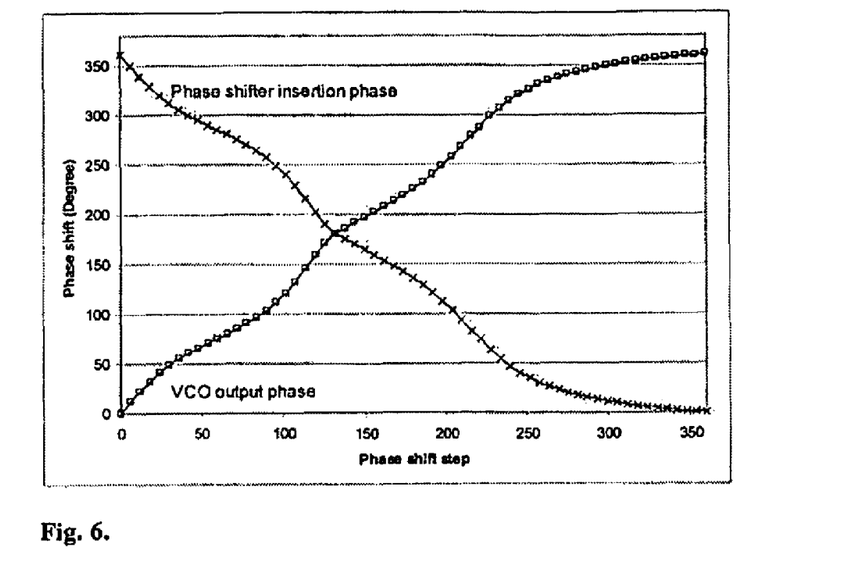
FIG. 6 is a graph showing the performance of the apparatus of FIG. 3.

As mentioned above, the variation in output phase of the VCO is inversely proportional to the variation in phase shift of the phase shifter. This is because the PLL works to counteract the phase shift and return the system to a steady state. This is illustrated in FIG. 6, which is a graph of the variation in VCO output phase and the variation in phase shifter insertion phase.

Figure 7:
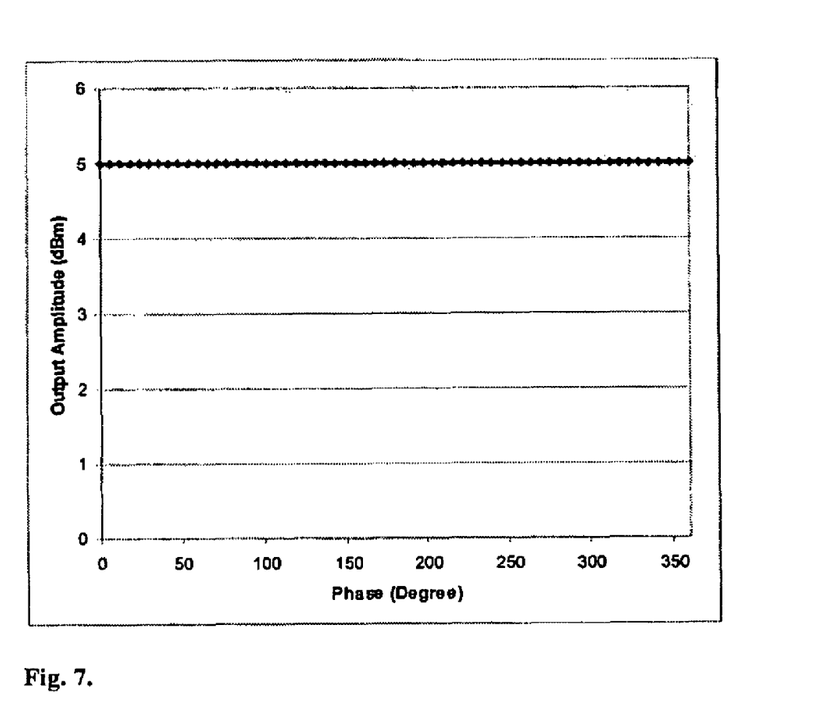
FIG. 7 is a graph showing the output amplitude against phase shift for the apparatus of FIG. 3.

As the phase of the VCO output signal is controlled indirectly, the phase shift has substantially no effect on the amplitude of the output signal. FIG. 7 is a graph showing the output amplitude of the VCO signal against the output phase.

Figure 5:
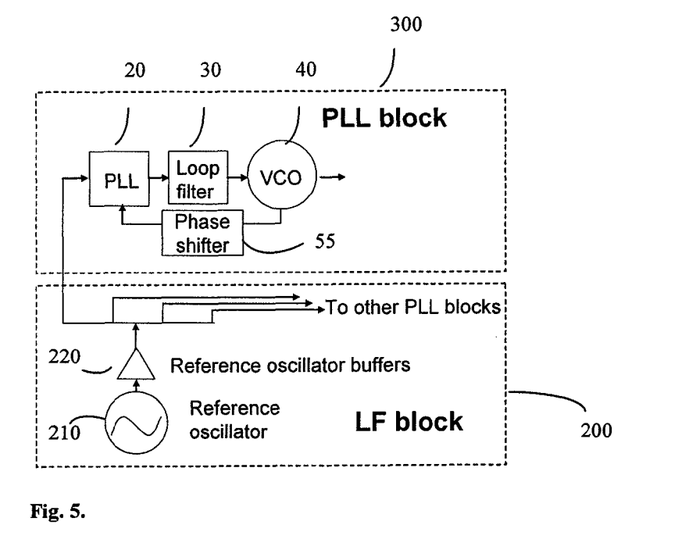
FIG. 5 is a schematic diagram showing an apparatus for controlling the output phase of a plurality of VCOs.

FIG. 5 is a schematic diagram of part of an apparatus for shifting the phase of a plurality of VCOs.

The apparatus has a low frequency (LF) block 200 and a plurality of PLL blocks. Just one of the PLL blocks 300 is shown in FIG. 5, but the others have the same arrangement. The PLL block has a PLL 20, a loop filter 30, a VCO 40 and a phase shifter 55. The PLL 20 preferably has the same arrangement as illustrated in FIG. 2. As in FIG. 2, the PLL has a first input for receiving a reference signal and a second input for receiving a feedback signal; its output controls the VCO 40. The phase shifter 55 is arranged for controlling the phase of the feedback signal on the feedback path between the VCO and the second input of the PLL. The phase shifter 55 is preferably a variable phase shifter. When the phase shifter is a variable phase shifter, the output phase of the VCO 40 can be controllably adjusted by adjusting the phase shift of the phase shifter 55, as described above for FIG. 2.

Although only one PLL block is shown in FIG. 5, there is a plurality of PLL blocks, each having the same arrangement as the illustrated PLL block 300. Each PLL block has a respective VCO, PLL and phase shifter. Preferably the phase shifters are variable phase shifters as discussed above. However, in an alternative embodiment the phase shifters 55 could be fixed phase shifters for shifting the phase of the feedback signal by a predetermined fixed amount. In that case the output phase of each VCO can be set by choosing an appropriate phase shifter (having the desired phase shift) for each PLL block in turn. For example a first PLL block could have a phase shifter with a fixed phase delay of 10 degrees. The second PLL block could have a phase shifter with a fixed phase delay of 20 degrees etc. However, it is preferred to use variable phase shifters for maximum flexibility and design choice. The phase shifters are independent of each other. This makes it possible to control the output phase of each VCO independently.

The apparatus has a single low frequency block 200. The low frequency block 200 has a single low frequency reference oscillator 210 which outputs the same reference signal to each of the PLL blocks 300. A reference oscillator buffer 220 (or amplifier) may optionally be provided between the reference oscillator 210 and the PLL blocks 300.

In this specification, "low frequency" preferably means less than 100 MHz and "high frequency" preferably means at least 500 MHz. The phase shifter on the feedback path preferably operates at "high frequency".

Generally the sensitivity of PLL chips is high and so the insertion loss caused by the phase shifter 55 does not effect operation of the circuit as long as the feedback signal can still be detected by the PLL.

The reference oscillator 210 may generate a reference signal of any appropriate frequency. Generally it will be a low frequency, preferably less than 100 MHz, e.g. 10 MHz. The reference signal will be divided after passing through the R-divider inside the PLL, e.g. by a factor of 10 to 1 MHz. The VCO may generate an output signal of any desired frequency; generally it will be a high frequency, e.g. a radio frequency. In one embodiment the frequency is at least 900 MHz. The VCO acts as a phased source outputting a signal at a desired phase controlled by the PLL and the phase shifter.

The VCOs in FIG. 5 preferably operate at substantially the same frequency. As the VCOs and PLL blocks are operating at substantially the same frequency and may be placed very close together, the VCOs may affect each other through injection locking. Therefore, to make the system more stable, it is preferred, but not essential, to couple the output of each VCO to a respective buffer (e.g. amplifier). E.g. each VCO may be coupled to a respective variable gain amplifier with high isolation. The variable gain amplifier not only increases the isolation between the VCO and the output port, but also controls the output amplitude. The outputs of each VCO can be set to different weightings for side-lobe suppression by the variable gain amplifiers.

In one preferred arrangement each variable gain amplifier controls the output amplitude in a 10 dB range from −5 dBm to 5 dBm.

Figure 8:
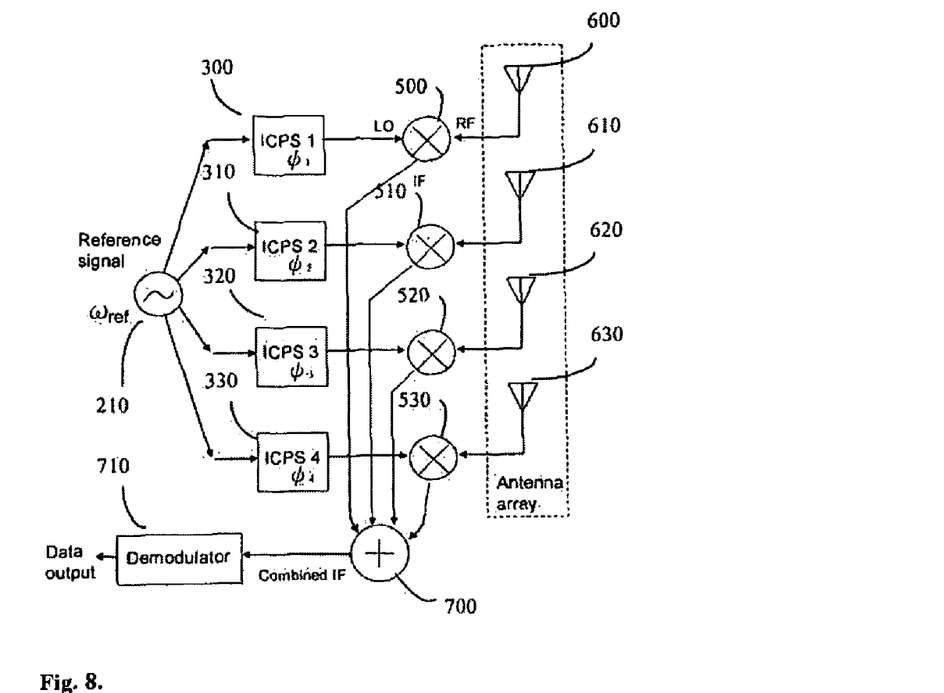
FIG. 8 is a schematic diagram showing an adaptive receiving array.

FIG. 8 is a schematic diagram of an adaptive receiving array. The adaptive receiving array comprises a reference oscillator 210 for generating a reference signal. The reference oscillator 210 generates a low frequency signal and is coupled to the inputs of a plurality (in this example four) PLL blocks 300, 310, 320, 330. Each PLL block has the same arrangement as illustrated for block 300 in FIG. 5. Each PLL block comprises a VCO, a PLL and a phase shifter on a feedback path between the VCO and the PLL. Preferably the phase shifters are variable phase shifters. The PLL blocks are also referred to as Indirect Controlled Phase Sources (ICPS) as they act of sources of radiation providing a signal of controlled phase, which is controlled indirectly (by the phase shifter). The PLL blocks 300, 310, 320, 330 each output to a respective mixer 500, 510, 520, 530. These outputs act as local oscillator signals for mixing with a received radio frequency signal from the antennas 600, 610, 620, 630.

The mixers 500, 510, 520, 530 each have a pair of inputs, one for receiving a signal from a respective PLL block and one for receiving a radio frequency signal from a respective antenna. The radio frequency signals from the antennas are mixed with the local oscillator signals from the PLL blocks. In this way the RF signals are converted to intermediate frequencies (IF) with proper phase setting controlled by the PLL blocks. The outputs of the mixers are coupled to a power combiner 700. The power combiner 700 combines the signals output from the mixers and outputs a combined signal to a demodulator 710 for demodulation.

Any suitable values may be chosen for the local oscillator (LO) frequency of the VCOs, the RF frequency of the antennas signals and the intermediate frequency (IF) output from the mixers.

In one preferred arrangement the LO, RF and IF frequencies are selected to be 900 MHz, 915 MHz and 15 MHz respectively. The antenna array comprising the antennas 600, 610, 620, 630 may be a 915 MHz L-probe patch antenna array with 0.4λ element separation. It is preferred to use a progressive phase setting for the four ICPS 300, 310, 320, 330 for the sake of simplicity. A progressive phase setting is a setting in which the phase of each consecutive ICPS differs from the last one by a fixed amount. E.g. if the progressive phase setting is 45 degrees, then the first ICPS 300 may be set at 0 degrees, the second ICPS 310 at 45 degrees, the third ICPS 320 at 90 degrees and the fourth ICPS at 120 degrees.

Figure 9:
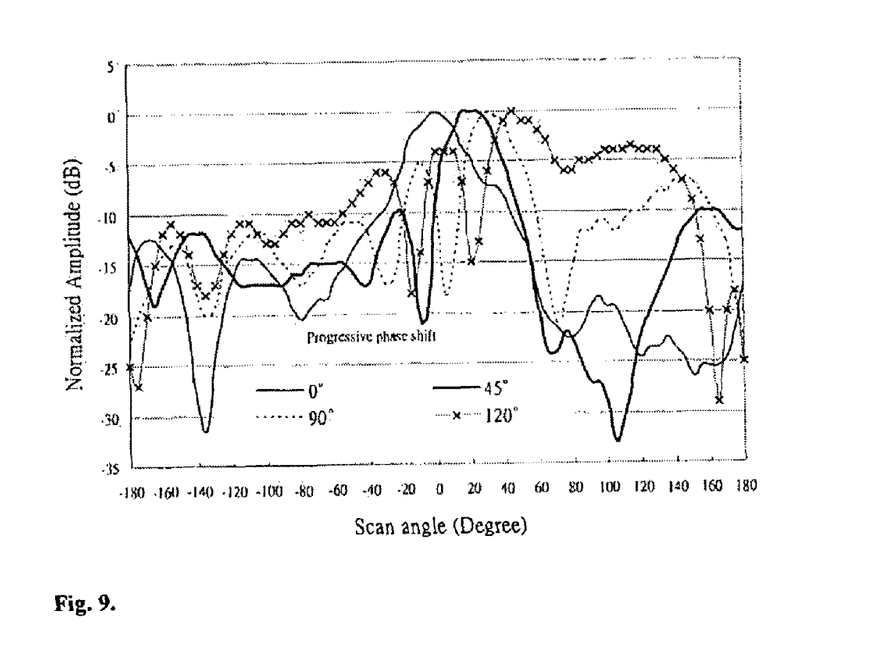
FIG. 9 is a graph showing the scan pattern of an adaptive receiving array at four different progressive phase shifts.

The apparatus was tested with the above preferred arrangement. The receiving beam patterns obtained at the combined IF output are shown in FIG. 9. The patterns for the cases of four different progressive phase settings (0°, 45°, 90° and 120°) are plotted. They result in four different beam tilts (0°, 20°, 35° and) 45°). It can be seen that the side-lobes are 5 dB and 3 dB below the main beam at 35° and 45° beam tilt respectively. It can be seen in FIG. 9, that the larger the beam tilt angle, the higher the side-lobes, which will degrade the ability of jamming rejection. Since the side-lobes at 45° beam tilt are 3 dB below the main beam only, that will usually not be enough for jamming signal rejection. Therefore 35° beam tilt is preferred as the maximum beam tilt angle in the system with the above described design. Side-lobes which are 5 dB below the main beam gives fairly good for jamming rejection.

Further tests were carried out and the signal-plus-noise-plus-distortion to noise-plus-distortion ratio (SINAD) was used to evaluate the system performance. SINAD is a quantitative measurement of the quality of an analog signal from a receiver. The definition of SINAD is simply the ratio of total signal power level to unwanted signal power. The higher SINAD implies a better quality of the received analog signal. This information can demonstrate the overall performance of the system rather than the antenna gain pattern only. In addition, the performance of the receiving channel with jamming signal can be evaluated by SINAD, while the gain pattern can represent neither the quality of demodulated signals nor the ability of jamming rejection. The ability of receiving direction tilting and jamming rejection was demonstrated by the following experiments.

A. The Adaptive Receiving Array Performance Without Jam

Figure 10:
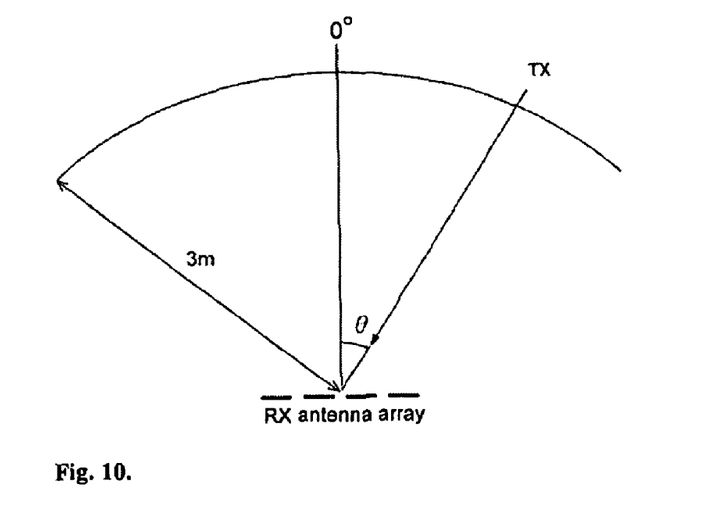
FIG. 10 is a diagram showing a set up for testing the apparatus of FIG. 8.
Figure 11:
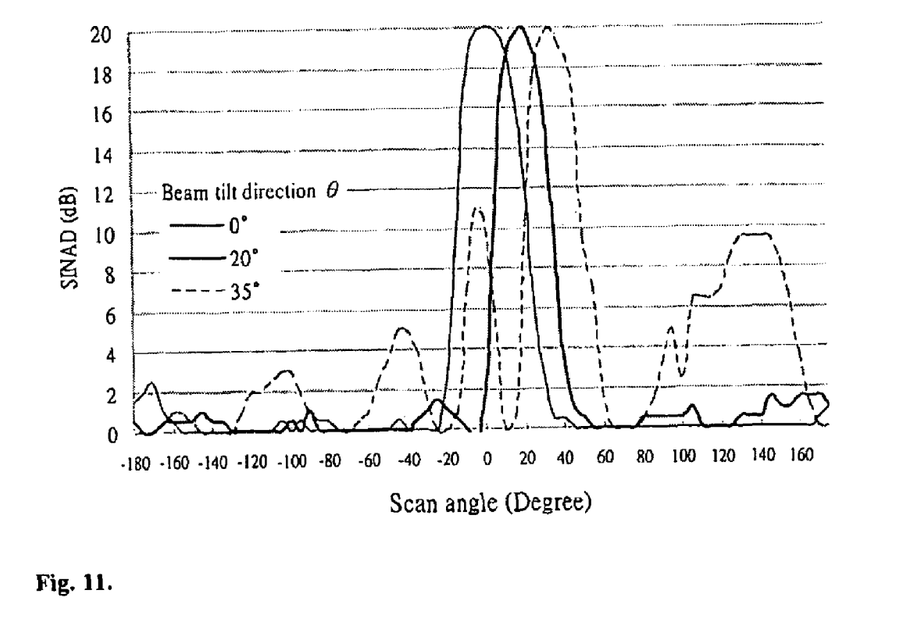
FIG. 11 is a graph showing the scan pattern measured using the set up of FIG. 10.
Figure 12:
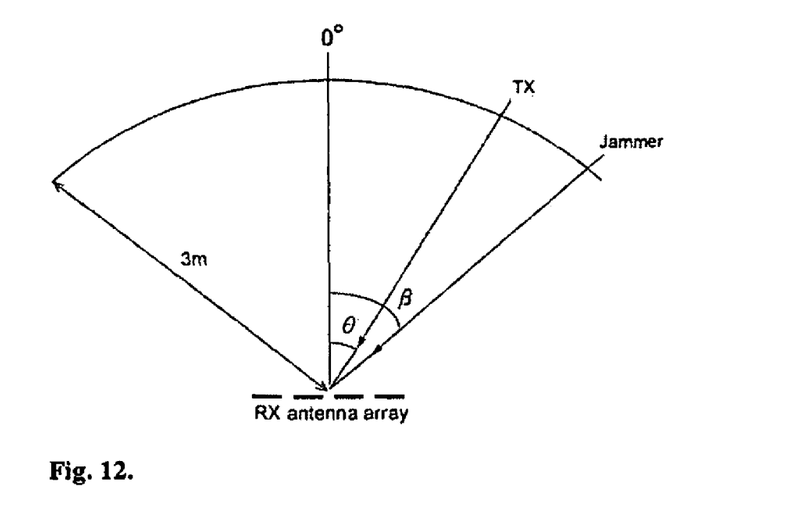
FIG. 12 is a diagram showing a set up for testing the beam rejection ability of the apparatus of FIG. 8.

During the experiment, a 1 kHz FM modulated 915 MHz signal with modulation bandwidth of 50 kHz was transmitted through a dipole 3 meters apart from the adaptive receiving array as shown in FIG. 10. The transmitting power was set to a certain level as low as the received signal obtaining 20 dB SINAD, which is a fair quality signal and the 20 dB SINAD would be taken as the normalized reference threshold throughout this paper. The SINAD curves for three beam tilt angles versus different transmitter (TX) angles θ are shown in FIG. 11. Thus it can be seen that the maximum SINAD could be obtained at the same directions as the main beams shown in FIG. 9. In cases of 0° and 20° beam tilts, the maximum SINAD outside the main beam were only 1.5 dB and 2.5 dB respectively. The maximum SINAD outside the main beam for case of 35° beam tilt was as high as 11 dB. Thus it can be seen that the maximum SINAD out of the main beam increases with the tilt angle.

B. The Adaptive Receiving Array Performance Under Jam

Figure 13:
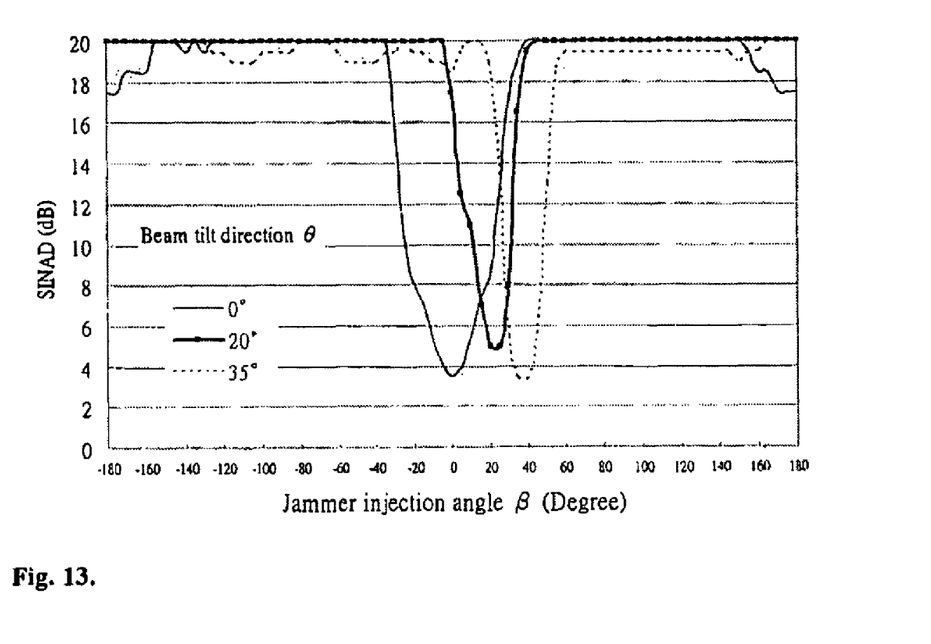
FIG. 13 is a graph showing the scan pattern measured using the set up of FIG. 12.

Another experiment setup was tested as shown in FIG. 13. The receiving beam was tilted towards TX at angle θ and a jamming signal with angle β apart from TX at the same distance of 3 meters. Both the wanted signal and the jamming signal were set at the same certain power level as low as the received signal obtaining 20 dB SINAD with the jamming signal off. The wanted signal was a 1 kHz FM modulated 915 MHz signal with modulation bandwidth of 50 kHz. The jamming signal was a 400 Hz FM modulated 915 MHz signal with modulation bandwidth of 50 kHz. The experiment shows that the adaptive receiving array can reject the interference efficiently from different directions. The SINAD curves for three beam tilt angles under jam are shown in FIG. 13. Less than 2 dB SINAD degradation at the unwanted directions can be observed in all the beam tilt settings, indicating that the performance was very good even for the case of 35° beam tilt. That is to say even 9 dB SINAD rejection was sufficient for rejecting interference signal from an unwanted direction. In other words, if a quantization comparator with 0.1% BER at 10 dB SINAD is connected to the system for digital communication, the interference rejection ability of 0°, 20° and 35° beam tilt will be ±20°, ±10° and ±10° respectively.

While certain preferred embodiments and experimental tests have been described above for the purpose of explaining the invention, they are not to be taken to limit the scope of the invention which is defined in the appended claims. Variations and changes to the embodiments could be made and will be apparent to a person skilled in the art, without departing from the scope of the claims. In particular the number of VCOs, PLL chips etc and the values of the frequencies used, types of antenna etc, may be changed.

Further, while an adaptive receiving array has been described above, it will be appreciated by those skilled in the art, that one or more indirect controlled phased sources could be used in a beam transmitting arrangement also. The present invention will find use in many applications where it is desired to control and or vary the phase of one or more output signals, especially but not limited to adjustment of the phase of radio frequency signals at high accuracy.

The invention claimed is:

1. An apparatus for controlling the output phase of a VCO, comprising:
    a phase locked loop having a first input for receiving a reference signal from a low frequency oscillator, a second input for receiving a feedback signal and an output for controlling a VCO;
    a VCO coupled to the output of the phase locked loop;
    a feedback path coupling a feedback signal from the VCO to said second input of the phase locked loop;
    a phase shifter on said feedback path between the VCO and said second input of the phase locked loop, the phase shifter being arranged for shifting the phase of the feedback signal by a controlled amount; the phase shifter being a variable phase shifter comprising a high pass filter, a low pass filter and a switchable by-pass, wherein the phase shifter is capable of shifting the phase of the feedback signal through a range of 0 to 360 degrees; wherein when a desired phase shift is in the range of 0-180 degrees the low pass filter is used and the by-pass is switched to by-pass the high pass filter; and wherein when the desired phase shift is in the range of 180-360 degrees both the high and low pass filters are used and the by-pass is switched off;
    a reference oscillator buffer coupled between said low frequency oscillator and said phase locked loop;
    wherein the output phase of the VCO being controlled on the basis of said reference signal and said feedback signal which has been phase shifted by said phase shifter; said output phase of said VCO varying inversely proportional to said shifting of said feedback signal by said phase shifter.

2. The apparatus according to claim 1 wherein the phase locked loop comprises a phase comparator having a first input for receiving a reference signal and a second input for receiving a feedback signal.

3. The apparatus of claim 1 comprising a reference oscillator for generating a reference signal, said reference oscillator being coupled to said first input of the phase locked loop.

4. The apparatus according to claim 1 wherein the VCO has an output which is coupled to an amplifier.

5. The apparatus of claim 1 wherein the phase shifter is a high frequency phase shifter for shifting the phase of a high frequency signal.

6. An apparatus for controlling the output phases of a plurality of VCOs, comprising:
    a plurality phased locked loops, each having a first input for receiving a reference signal, a second input for receiving a feedback signal and an output for controlling a VCO;
    a plurality of VCOs, each VCO being associated with and coupled to the output of a respective phase locked loop;
    a plurality of feedback paths, each feedback path being between a respective VCO and its associated phase locked loop;
    each feedback path having a respective phase shifter for shifting the phase of a feedback signal by a controlled amount;
    wherein the output phase of each VCO being controlled on the basis of a respective reference signal and a respective feedback signal which has been phase shifted by a respective phase shifter.

7. The apparatus of claim 6 wherein said respective phase shifters are variable phase shifters for controllably varying the amount by which the phase of the feedback signal is shifted.

8. The apparatus of claim 6 comprising a plurality of amplifiers, wherein each VCO has an output coupled to a respective amplifier.

9. The apparatus of claim 6 comprising a plurality of antennas and a plurality of mixers, each antenna being coupled to a respective mixer and each VCO being coupled to a respective mixer.

10. The apparatus of claim 9 wherein said antennas are coupled to first inputs of the mixers and each VCO has an output coupled to a second input of a respective mixer; and wherein each mixer has an output which is coupled to a combiner.

11. A method of controlling the output phase of a VCO comprising providing a phase locked loop having a first input for receiving a reference signal from a low frequency oscillator, a reference oscillator buffer coupled between said low frequency oscillator and said phase locked loop, a second input for receiving a feedback signal and an output coupled to the VCO; providing a phase shifter on a feedback path between the VCO and the second input of the phase locked loop; the phase shifter being a variable phase shifter comprising a high pass filter, a low pass filter and a switchable by-pass, wherein the phase shifter is capable of shifting the phase of the feedback signal through a range of 0 to 360 degrees; wherein when a desired phase shift is in the range of 0-180 degrees the low pass filter is used and the by-pass is switched to by-pass the high pass filter; and wherein when the desired phase shift is in the range of 180-360 degrees both the high and low pass filters are used and the by-pass is switched off; injecting a reference signal into the first input of the phase locked loop, directing a feedback signal from the output of the VCO to the second input of the phase locked loop via said feedback path, shifting the phase of the feedback signal by a controlled amount with the phase shifter before said feedback signal reaches the second input of the phase locked loop and controlling the output phase of the VCO on the basis of said reference signal and said feedback signal which has been phase shifted by said phase shifter; wherein said output phase of said VCO varying inversely proportional to said shifting of said feedback signal by said phase shifter.

12. The method of claim 11 wherein the phase locked loop comprises a phase comparator having a first input for receiving a reference signal and a second input for receiving a feedback signal.

13. The method of claim 11 wherein the reference signal is generated by a low frequency reference oscillator.

14. The method of claim 11 wherein the variable phase shifter on the feedback loop shifts the phase of a high frequency feedback signal.

15. A method of controlling an array of antennas, wherein each antenna in said array is coupled to the output of a respective VCO and the output phase of each VCO is controlled independently according to the method of claim 11.

* * * * *